United States Patent
Castagna et al.

(10) Patent No.: US 9,239,583 B2
(45) Date of Patent: Jan. 19, 2016

(54) CIRCUIT FOR GENERATION OF AN ELECTRIC CURRENT WITH A CONFIGURABLE VALUE

(71) Applicant: STMICROELECTRONICS S.R.L., Agrate Brianza (IT)

(72) Inventors: Giuseppe Castagna, Palermo (IT); MaurizioFrancesco Perroni, Furnari (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 77 days.

(21) Appl. No.: 13/899,829

(22) Filed: May 22, 2013

(65) Prior Publication Data
US 2013/0321068 A1 Dec. 5, 2013

(30) Foreign Application Priority Data

May 31, 2012 (IT) ............................... TO2012A0479

(51) Int. Cl.
| | | |
|---|---|---|
| *G05F 1/10* | (2006.01) | |
| *G05F 3/02* | (2006.01) | |
| *G05F 1/46* | (2006.01) | |
| *G11C 5/14* | (2006.01) | |
| *G11C 16/30* | (2006.01) | |
| *G11C 29/02* | (2006.01) | |

(52) U.S. Cl.
CPC .............. *G05F 1/468* (2013.01); *G11C 5/147* (2013.01); *G11C 16/30* (2013.01); *G11C 29/021* (2013.01)

(58) Field of Classification Search
CPC ......... G05F 1/465; G05F 3/262; G05F 3/247; G05F 3/24; G11C 5/147

USPC .......... 327/536, 539, 541, 543, 540; 323/313, 323/315
See application file for complete search history.

(56) References Cited

U.S. PATENT DOCUMENTS

| | | | | |
|---|---|---|---|---|
| 5,232,315 A | * | 8/1993 | Dugge .......................... | 406/145 |
| 6,459,326 B2 | * | 10/2002 | Descombes ................... | 327/513 |
| 7,573,346 B2 | * | 8/2009 | Hagino ......................... | 331/160 |
| 8,269,550 B2 | * | 9/2012 | Jurasek et al. ................ | 327/540 |
| 8,493,137 B2 | * | 7/2013 | Passerini et al. ............... | 327/541 |
| 2006/0092066 A1 | * | 5/2006 | Pan ................................ | 341/154 |
| 2006/0232326 A1 | | 10/2006 | Seitz et al. | |
| 2008/0238401 A1 | * | 10/2008 | Wang ............................ | 323/315 |
| 2011/0050330 A1 | | 3/2011 | Miki et al. | |

FOREIGN PATENT DOCUMENTS

JP 2011175712 A * 9/2011

* cited by examiner

*Primary Examiner* — Quan Tra
(74) *Attorney, Agent, or Firm* — Allen, Dyer, Doppelt, Milbrath & Gilchrist, P.A.

(57) ABSTRACT

A current-generator circuit is for generation of an output current of a value that is configurable as a function of a configuration signal. The circuit may have a first reference resistor element traversed by an intermediate current, the value of which is a function of a reference current, for supplying a first reference voltage. The circuit may also include a resistive divider stage receiving the configuration signal and supplying a second reference voltage as a function of the first reference voltage and of the configuration signal. A second reference resistor element supplies, as a function of the second reference voltage ($V_{ref2}$), the output current on the output terminal. The value of resistance of the second reference resistor element may be matched to a respective value of resistance of the first reference resistor element.

20 Claims, 6 Drawing Sheets

CIRCUIT FOR GENERATION OF AN ELECTRIC CURRENT WITH A CONFIGURABLE VALUE

FIELD OF THE INVENTION

The present invention relates to a circuit for generation of an electric current with a configurable value.

BACKGROUND OF THE INVENTION

The following discussion will make explicit reference, to the generation of a load current for electrical testing of an electronic device, such as, for example, a charge pump. As it is known, charge pumps are used in a wide range of applications for supplying boosted voltages, starting from input voltages of a value lower than a desired value. For example, in memory devices, charge pumps supply the voltages required for the operations of modifying, programming, or erasing, which have high values, higher than the value of the supply voltage available in the same memory devices.

During electrical testing of a charge pump integrated in a body of semiconductor material, such as silicon, it is desired to obtain its voltage/current characteristic curve, as the temperature, clock frequency, and supply voltage vary. This electrical test is, for example, envisaged for the step of validation of the memory device in which the charge pump is used, a step that uses characterization of all the analog circuit blocks internal to the device, both low-voltage ones (for example, oscillators, band-gap reference circuits, etc.), and high-voltage ones (for example, the charge pumps).

For this purpose, a known load current is generally set, the value of which is appropriately varied during the testing operation, and the value of the output voltage generated by the charge pump is measured.

In this way, the voltage/current characteristic of the charge pump is obtained, as illustrated by way of example in FIG. 1, where the variation of the non-regulated output voltage $V_{out}$ of the charge pump is shown as a function of the load current $I_L$. The output voltage is between a maximum value $V_{out\_max}$ and a minimum value $V_{out\_min}$. FIG. 1 also shows the regulated output value $V_{reg}$ (ON/OFF type regulation) of the charge pump. In the case illustrated, referred to the use in a memory device of a Flash type, the load current $I_L$ has, for example, a value on the order of several milliamps.

The value of the load current should remain stable as the supply voltage, the temperature, and the parameters of the manufacturing process (the so-called "process spread") vary, in particular owing to the so-called "process corners", i.e., the limit or worst cases.

Known approaches for electrical testing of a charge pump in a memory device envisage the load current $I_L$ to be set, either inside the memory device or outside the memory device, via a testing machine or testing device.

As shown schematically in FIG. 2, in the case of internal generation of the load current in a memory device, designated as a whole by reference numeral 1, the charge pump, designated by 2 is coupled, inside the memory device 1 (i.e., in the same chip of semiconductor material), to a current generator 4, which supplies the load current $I_L$, of a value that is known and is set beforehand, and which may vary in a desired way for the purposes of the voltage/current characterization.

The storage device 1 further includes a transfer stage 5 including a plurality of pass transistors to transfer to a testing device, designated by 6 (the so-called "tester"), the output voltage $V_{out}$ generated by the charge pump 2.

As shown in FIG. 3, the current generator 4 has a current-mirror configuration, where, starting from a reference current $I_{ref}$, the load current $I_L$ is generated at the output by a plurality of current-mirror stages $S_0 \ldots S_n$ enabled by respective enable bits $B_0 \ldots B_n$. Each current-mirror stage $S_0 \ldots S_n$ supplies on an internal node $N_1$ a current equal to the reference current $I_{ref}$ multiplied by a factor $2^i$ (i being an index that ranges from 0 to n).

The current generator 4 further comprises an output stage 6, which is also provided by a current mirror having an output transistor 8, which supplies on a drain terminal thereof the load current $I_L$.

This known approach has, however, some drawbacks. In the first place, it requires a considerable area occupation in the integrated realization, on account of the large number of current-mirror stages required for boosting the input current (even by a factor of 100 or higher).

Moreover, this approach does not guarantee a sufficient precision for many applications in so far as the exact value of the load current $I_L$ depends upon the output voltage $V_{out}$ of the charge pump 2 (see also FIG. 2). In fact, the output voltage $V_{out}$ is the biasing voltage present on the drain terminal of the aforesaid output transistor 8.

In a further approach of a known type, shown in FIG. 4, the load current $I_L$ for electrical testing of the charge pump, designated once again by 2, is generated outside the memory device 1, by the testing device 6. However, also this approach is not free from drawbacks.

In particular, an imprecision arises in reading the output voltage $V_{out}$ generated by the charge pump 2, which is altered by the drop on the pass transistors in the transfer stage 5 inside the memory device 1, which is used to enable the measurement path, which is traversed by the load current $I_L$.

SUMMARY OF THE INVENTION

An object of the present invention is consequently to address, at least in part, the problems previously highlighted, and in particular to provide a current-generator circuit that may, for example, be integrated in a memory device for enabling electrical testing of at least one operating stage thereof, for example, including a charge pump.

A circuit may be used for generation of an output current of a value that is configurable as a function of a configuration signal. The circuit may include an input terminal is configured to receive a reference current, and an output terminal configured to supply the output current. A first reference resistor element is configured to be traversed by an intermediate current having a value which is a function of the reference current to thereby supply a first reference voltage. A resistive divider stage is configured to receive the configuration signal and supply a second reference voltage as a function of the first reference voltage and of the configuration signal. In addition, the circuit includes a second reference resistor element configured to supply, as a function of the second reference voltage, the output current on the output terminal. The second reference resistor element may have a resistance value being related to a respective resistance value of the first reference resistor element.

BRIEF DESCRIPTION OF THE DRAWINGS

For a better understanding of the present invention, preferred embodiments thereof are now described, purely by way of non-limiting example, with reference to the attached drawings, wherein.

DETAILED DESCRIPTION OF THE PREFERRED EMBODIMENTS

One aspect of the present invention envisages generation of an electric current with a configurable value, for example, within a memory device for electrical testing of a corresponding charge pump, starting from a reference current $I_{ref}$ of a known value, for example, that is already available within the memory device.

The reference current $I_{ref}$ may be supplied by a band-gap stage of the memory device (of a known type, as described, for example, on pages 478-479 of "CMOS Circuit Design, Layout, and Simulation", R. Jacob Baker, Harry W. Li and David E. Boyce, Wiley-IEEE Press, Aug. 8, 1997), and has pre-defined and stable values as a function of the supply voltage and temperature. The reference current $I_{ref}$ is normally used as current reference for biasing the analog circuits present in the memory device. The values of the reference current $I_{ref}$ are, for example, of the order of some tens of microamps, for example, between 15 and 20 µA.

Figure 1:
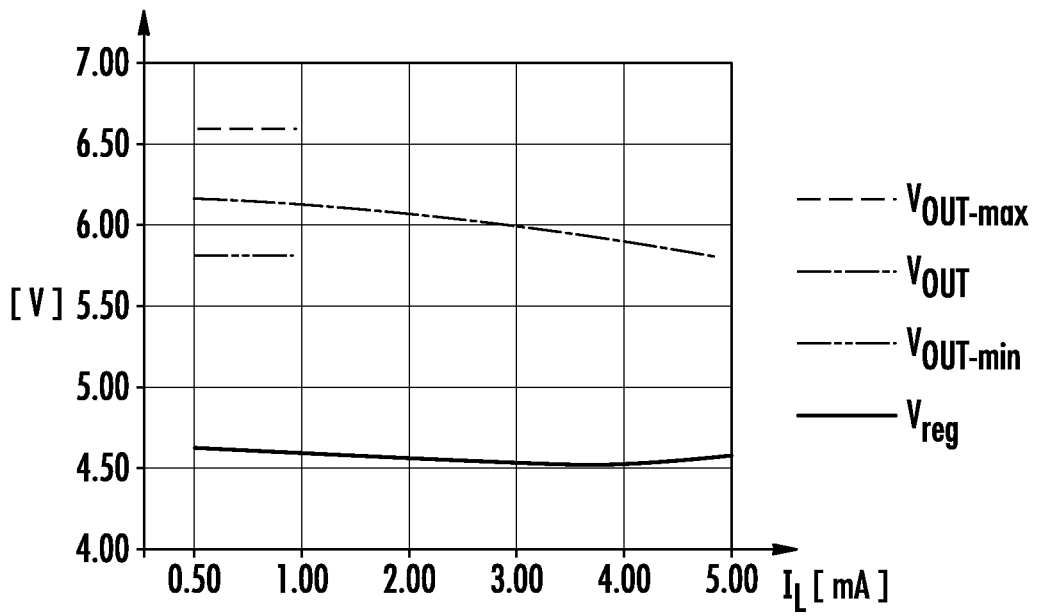
FIG. 1 shows a voltage/current diagram of a charge pump, of a known type.
Figure 2:
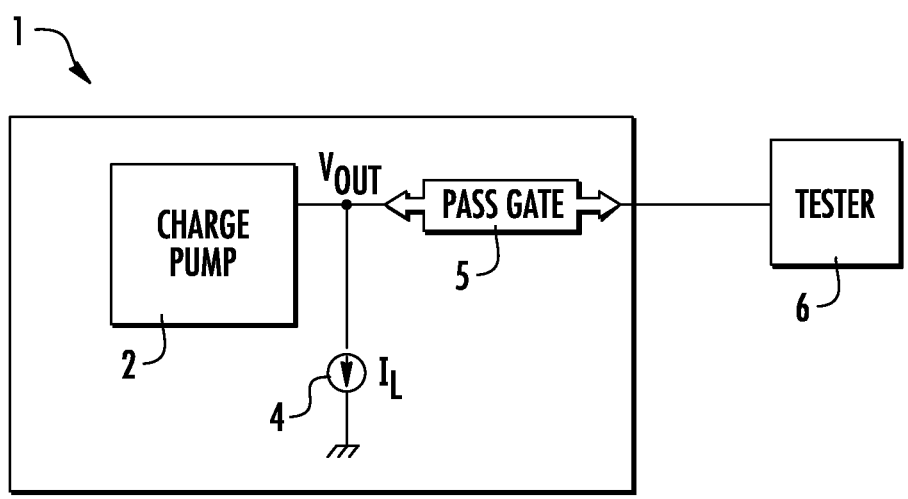
FIG. 2 shows a block diagram of a first electrical testing system of a charge pump in a memory device of a known type.
Figure 3:
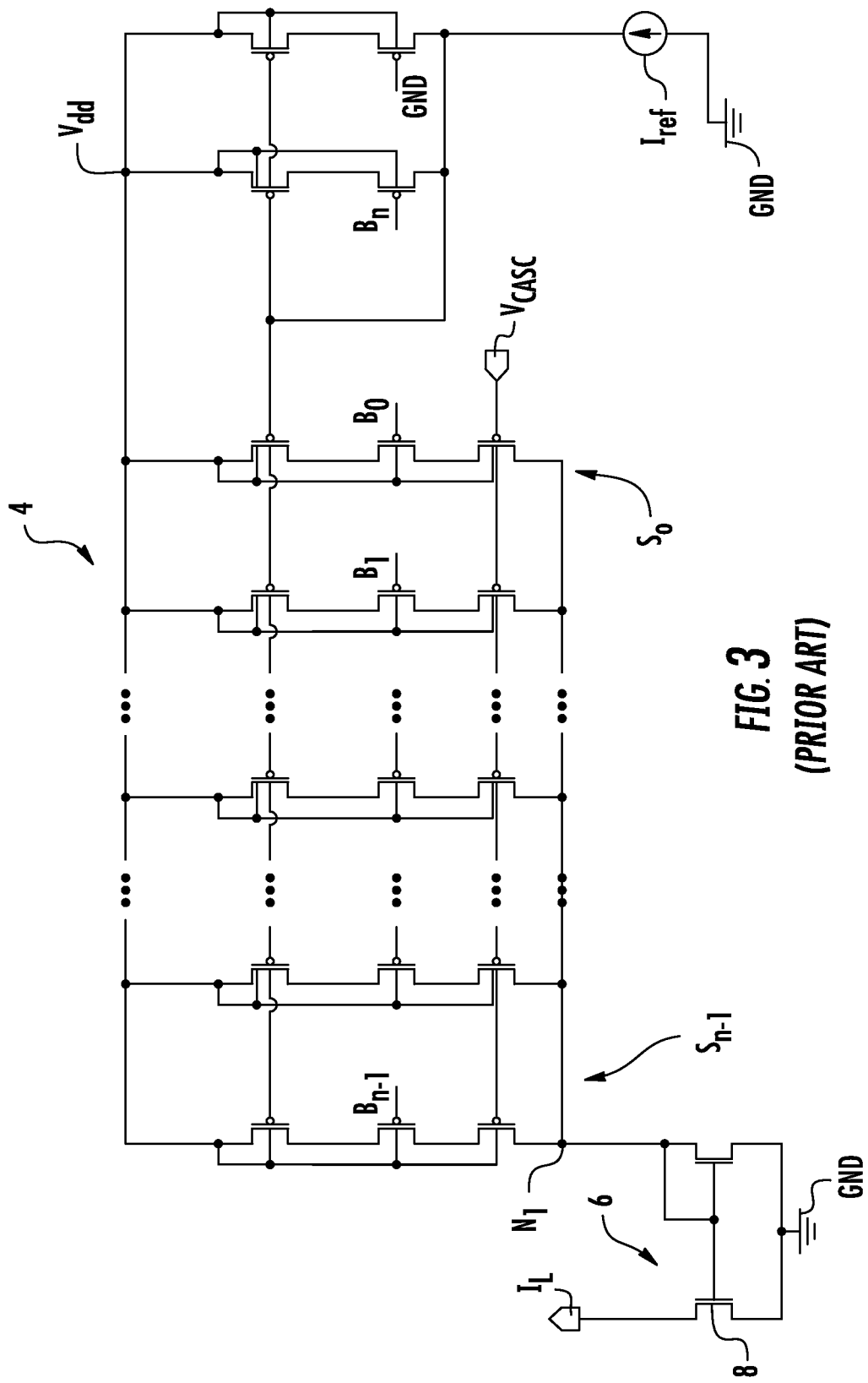
FIG. 3 shows a circuit diagram of a load-current generator in the system of FIG. 2.
Figure 4:
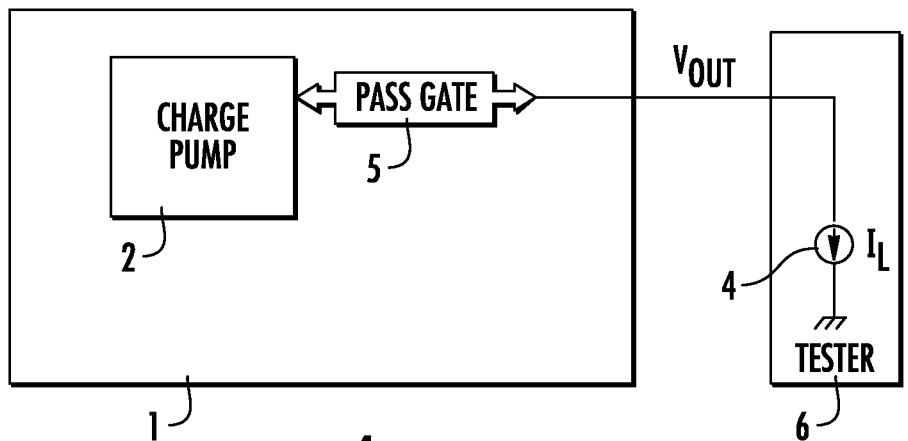
FIG. 4 shows a block diagram of a second electrical testing system of a charge pump in a memory device, of a known type.
Figure 5:
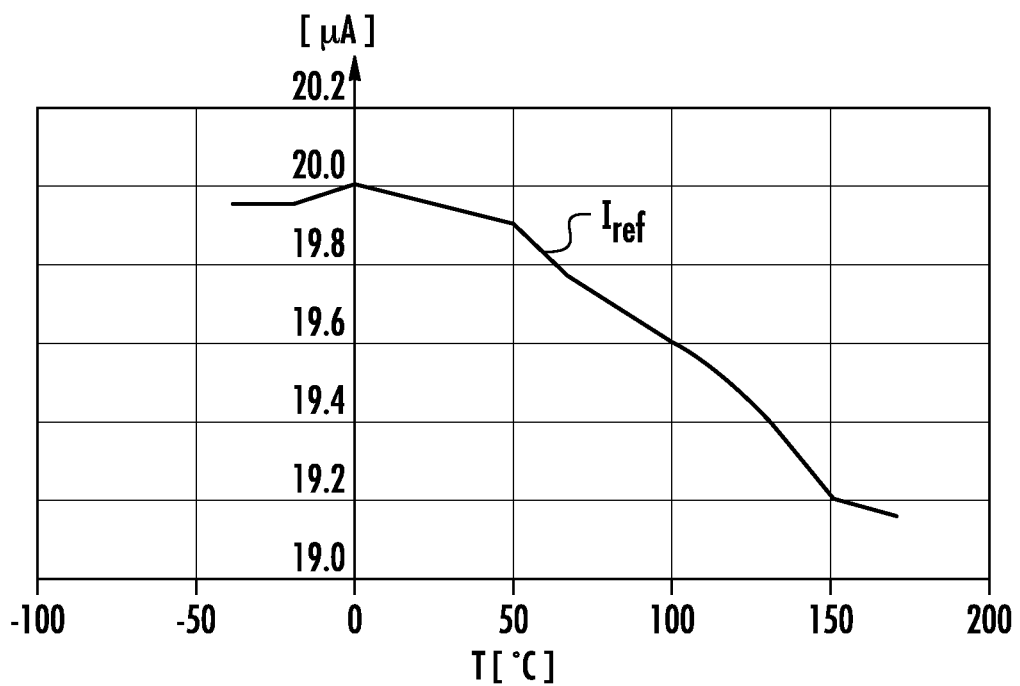
FIG. 5 shows a the plot of a reference current used in a current-generator circuit according to an aspect of the present invention.

FIG. 5 shows a possible plot of the reference current $I_{ref}$ as the temperature T varies for a given supply voltage $V_{a1}$ (for example, 1.2 V).

Figure 6:
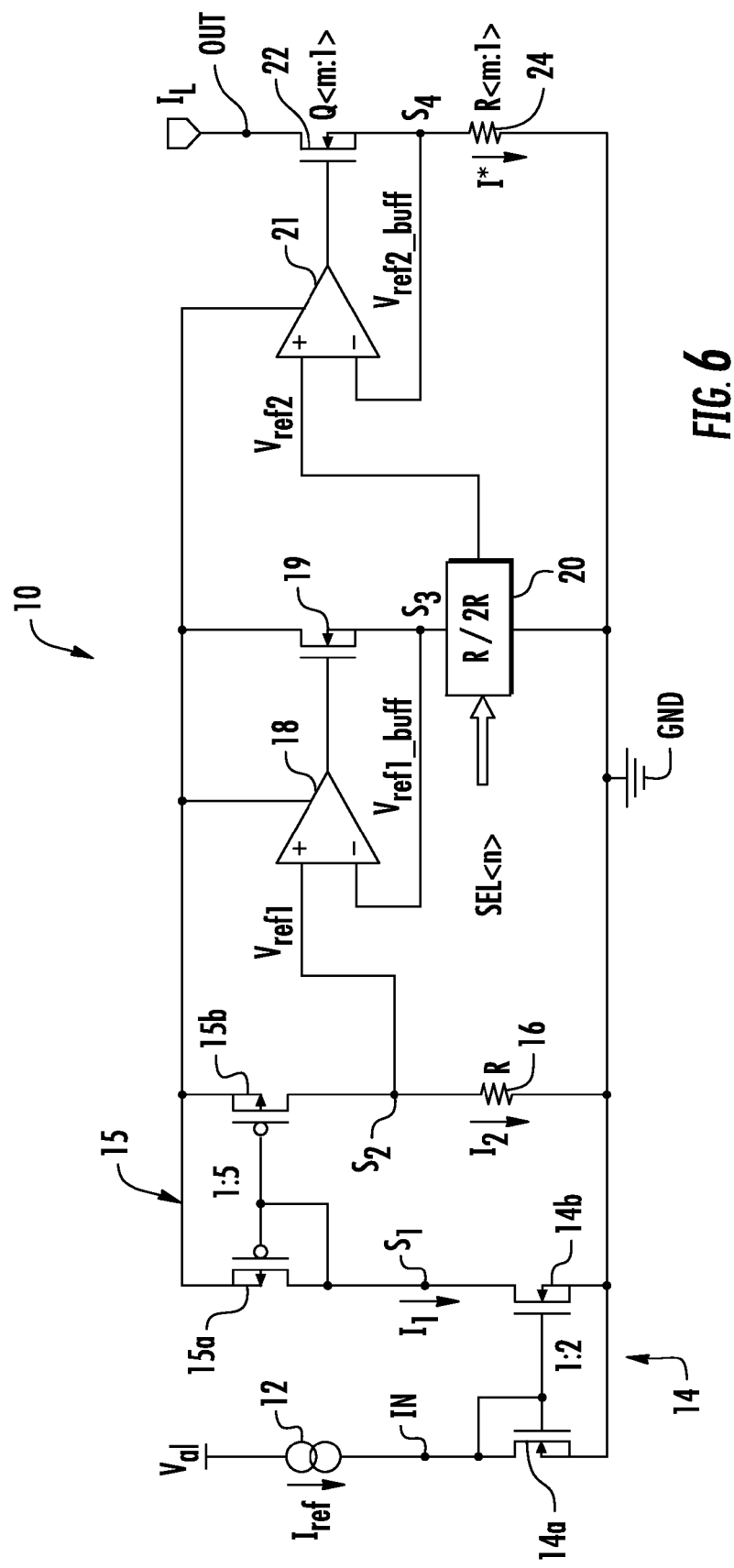
FIG. 6 shows an electrical diagram of a current-generator circuit, according to one embodiment of the present invention.

FIG. 6 shows a current-generator circuit, designated as a whole by 10, for generating an output electric current, in particular a load current $I_L$, starting from the reference current $I_{ref}$, with a value that varies as a function of a configuration word SEL<n> including n bits. The possibility of configuration of the load current $I_L$ is, for example, such as to provide a scan of all the values required for complete characterization of a charge pump present within the memory device.

In detail, the current-generator circuit 10 has an input IN, designed to be connected to a generator stage 12, outside the circuit, which supplies the reference current $I_{ref}$ (for example, a generator of a bandgap type).

The current-generator circuit 10 comprises a first current mirror 14 having a first branch connected to the input IN and a second branch connected to a first internal node $S_1$, on which it supplies a first intermediate current $I_1$ having a value increased with respect to the value of the reference current $I_{ref}$ according to a first mirroring ratio (for example, equal to two).

The first current mirror 14 is provided by a first NMOS transistor 14a, diode-connected between the input IN and a first reference terminal of the circuit, for example, connected to ground GND, and by a second NMOS transistor 14b, connected between the first reference terminal and the first internal node $S_1$, having its control terminal connected to the respective control terminal of the first NMOS transistor 14a and supplying the first intermediate current $I_1$.

The current-generator circuit 10 further comprises a second current mirror 15 having a first branch connected to the first internal node $S_1$ and a second branch connected to a second internal node $S_2$, on which it supplies a second intermediate current $I_2$ having a value increased with respect to the value of the first intermediate current $I_1$, on the basis of a second mirroring ratio (for example, five).

The second current mirror 15 is provided by a first PMOS transistor 15a, diode-connected between the first internal node $S_1$ and a second reference terminal of the circuit, and by a second PMOS transistor 15b, connected between the second reference terminal and the second internal node $S_2$, having its control terminal connected to the respective control terminal of the first PMOS transistor 15a and supplying the second intermediate current $I_2$.

The current-generator circuit 10 further comprises: a first reference resistor element 16, connected between the second internal node $S_2$ and the first reference terminal so as to be traversed by the second intermediate current $I_2$ and generate across it a first reference voltage $V_{ref1}$ (present on the second internal node $S_2$); and a first buffer 18, provided by an operational amplifier having a first, non-inverting, pin, connected to the second internal node $S_2$, and a second, inverting, pin, connected to a third internal node $S_3$, on which is present a buffered version of the first reference voltage $V_{ref1}$, designated by $V_{ref1\_buff}$, the value of which is substantially equal to the value of the first reference voltage $V_{ref1}$. The output of the operational amplifier is connected to the control terminal of a first reference transistor 19, of an NMOS type, connected between the third internal node $S_3$ and the second reference terminal.

In particular, the value of the first reference voltage $V_{ref1}$ is equal to:

$$V_{ref1} = I_2 \cdot R$$

where R is the value of resistance of the first reference resistor element 16, and is hence a function, in a known way, of the parameters and of the spread of the process of manufacture of the resistor.

According to an aspect, the current-generator circuit 10 further comprises a resistive divider stage 20, in particular of an R/2R type (of a known type, described in any case with reference to FIG. 7), connected to the third internal node $S_3$ and supplying at an output a second reference voltage $V_{ref2}$, the value of which is a function of the buffered voltage $V_{ref1\_buff}$, and, moreover, of the configuration word SEL<n> that the resistive divider stage 20 receives at its input.

In particular, the value of the second reference voltage $V_{ref2}$, which is configurable as a function of the configuration word SEL<n:0>, is given by the following expression:

$$V_{ref2} = \sum_{i=0}^{n} SEL\langle i \rangle \cdot \frac{V_{ref1\_buff}}{2^{(n+1-i)}}$$

and may consequently assume $2^n$ different values, as a function of the value ('0' or '1') of the n configuration bits of the configuration word SEL<n>.

The current-generator circuit 10 further comprises a second buffer 21, provided by a respective operational amplifier having a first, non-inverting, pin connected to the output of the resistive divider stage 20 and receiving the second reference voltage $V_{ref2}$, and a second, inverting, pin connected to a fourth internal node $S_4$, on which is present a buffered version of the second reference voltage $V_{ref2}$, designated by $V_{ref2\_buff}$, whose value is substantially equal to the value of the second reference voltage $V_{ref2}$. The output of the operational amplifier is connected to the control terminal of a second reference transistor 22, of an NMOS type, connected between the fourth internal node $S_4$ and an output Out.

According to an aspect, a second reference resistor element 24 is connected between the fourth internal node $S_4$ and the second reference terminal. In particular, the second reference resistor element 24 has a value of resistance strictly matched via the manufacturing process to the value of the first reference resistor element 16, with a matching factor m, namely:

$$R' = \frac{R}{m}$$

where R' is the value of resistance of the second reference resistor element 24. In other words, the first and second resistor elements 16, 24 undergo variations that are substantially identical with respect to the manufacturing process.

Advantageously, the first reference resistor element 16 and the second PMOS transistor 15b define a first cell, and the second reference resistor element 24 and the second reference transistor 22 define a second cell, matched to the first cell via the matching factor m (the second reference transistor 22 having hence a width/length—W/L—sizing ratio that is m times the respective sizing ratio of the second PMOS transistor 15b).

Consequently, an electric current I* is generated through the second reference resistor element 24, the value of which is independent of the process parameters and which substantially defines the load current $I_L$ supplied by the current-generator circuit 10 on the output OUT. In fact, the load current $I_L$ is given by the following expression:

$$I_L = \frac{V_{ref2\_buff}}{R'}$$

and hence has a value independent of the value of resistance R and the corresponding process variations (as well as independent of the variations of the temperature and of the supply voltage by virtue of the dependence upon the reference current $I_{ref}$).

Moreover, advantageously, the value of the load current $I_L$ is configurable via the selection word SEL<n> and may assume $2^n$ different values, which may, for example, be used for the operations of electrical testing of an electronic device, such as a charge pump.

In particular, the load current $I_L$ has, as will be evident, a maximum value $I_{Lmax}$ equal to m times the value of the second intermediate current $I_2$ $$I_{L\,max} = m \cdot I_2$$

when the voltage $V_{ref2\_buff}$ assumes a value substantially equal to the value of the first reference voltage $V_{ref1}$.

Figure 7:
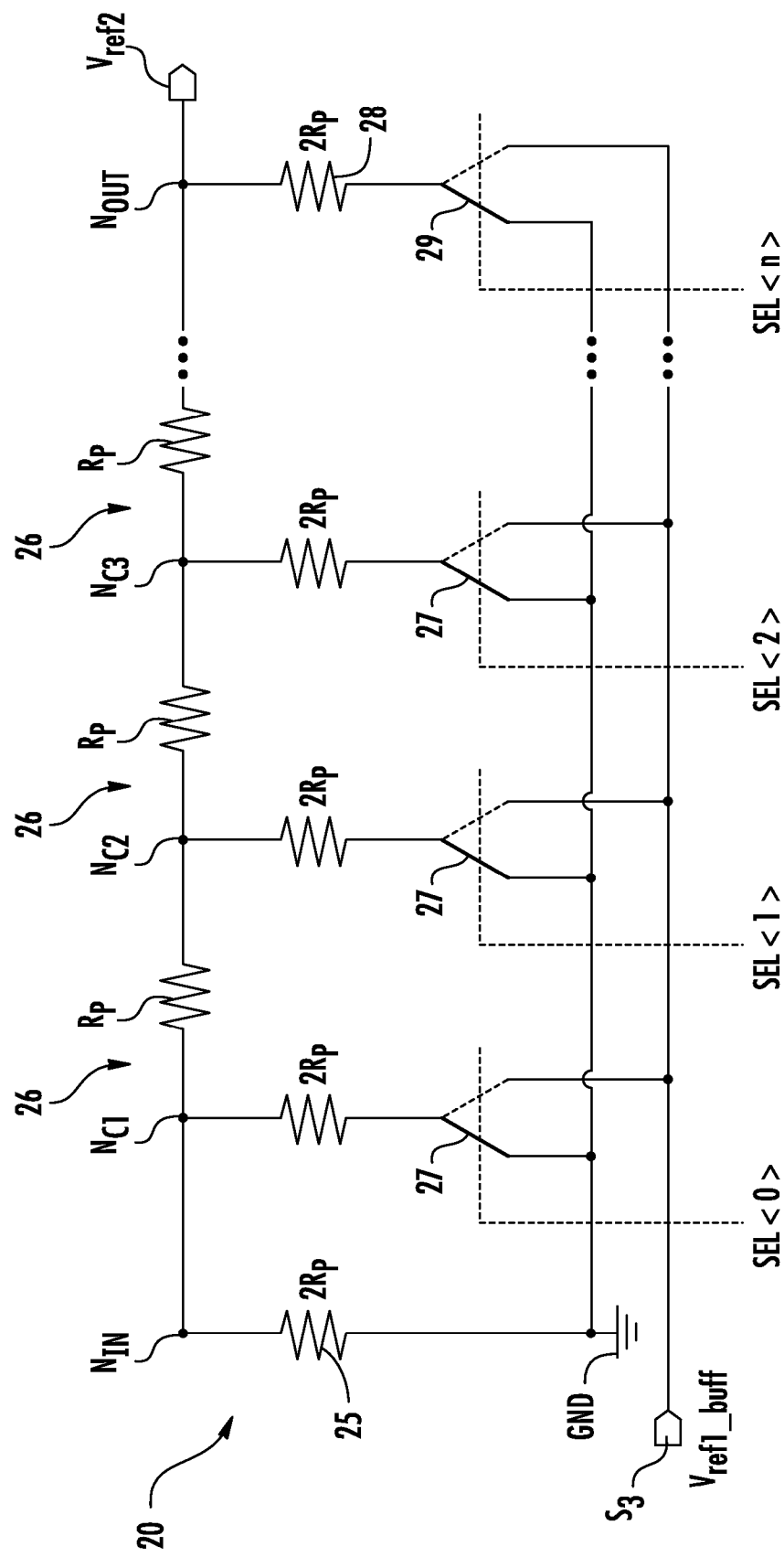
FIG. 7 shows an electrical diagram exemplifying a resistive divider stage of the current-generator circuit of FIG. 6.

By way of example, FIG. 7 illustrates a possible embodiment of the resistive divider stage 20, of the R/2R type.

In detail, the resistive divider stage 20 has a first internal line, connected to the third internal node 53 and set at the voltage $V_{ref1\_buff}$, and a second internal line, set at ground GND, and comprises an input branch 25 constituted by a resistor, having a value of resistance $2R_p$, connected between the second internal line and an input node $N_{in}$.

The resistive divider stage 20 further comprises a plurality of cells 26, equal in number to the number of bits in the selection signal SEL<n>, connected in cascaded fashion. Each is provided by: a respective first resistor, with a value of resistance $2R_p$, having a first terminal connected to a first cell node $N_{c1}$ (in the case of the first cell 26 of the plurality of cells, coinciding with the input node $N_{in}$) and a second terminal, which may selectively be connected between the first internal line or the second internal line a switch 27 controlled by a respective bit of the selection signal SEL<n>, starting from the first bit SEL<0>; and a respective second resistor, with a value of resistance $R_p$, having a first terminal connected to the first cell node $N_{c1}$, and a second terminal connected to a second cell node $N_{c2}$ (coinciding with the first cell node of the next cell 26).

The resistive divider stage 20 further comprises an output branch 28 provided by a respective resistor, with value of resistance $2R_p$, having a first terminal connected to the second cell node $N_{c2}$ of the last cell 26 of the plurality of cells, coinciding with an output node $N_{out}$, on which is supplied the second reference voltage $V_{ref2}$, and a second terminal selectively connectable to the first internal line or to the second internal line by a respective switch 29 controlled by the last bit of the selection signal SEL<n>.

Operation of the resistive divider stage 20, of a known type, need not be described in further detail herein.

Figure 8:
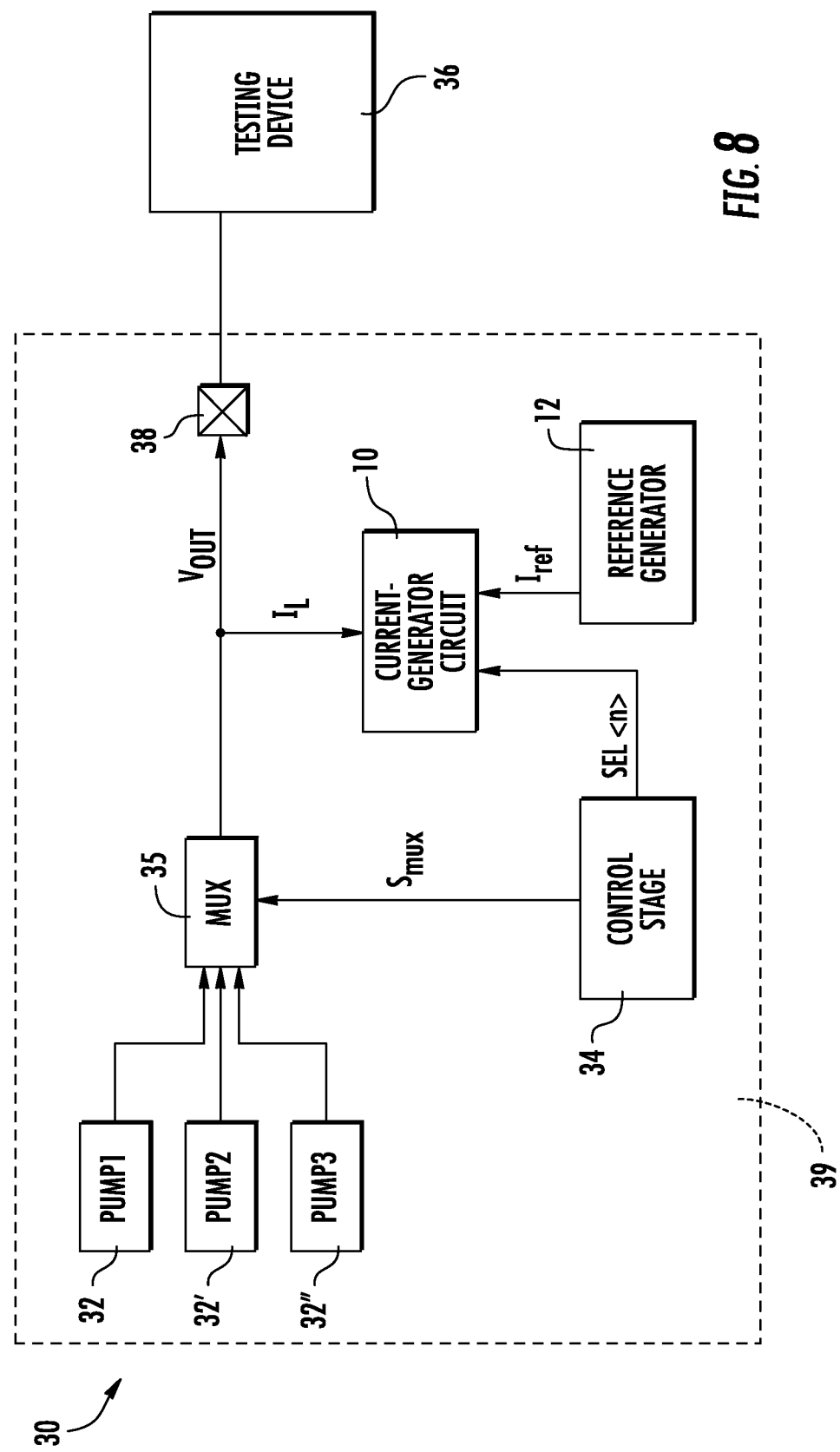
FIG. 8 shows a block diagram of an electronic device, in particular a memory device, including the current-generator circuit of FIG. 6.

FIG. 8 illustrates an electronic device, designated as a whole by 30, for example, a memory device, including in one and the same chip of semiconductor material: the current-generator circuit 10; the generator stage 12, for example, a band-gap stage, designed to generate the reference current $I_{ref}$ for the current-generator circuit 10; one or, as in the case represented, a number of operating stages, here designated by 32, 32', 32", each including, for example, a respective charge pump; and a control stage 34, for example, including a microprocessor, a microcontroller, or similar processing element.

The current-generator circuit 10 is, for example, used for generating the load current $I_L$ for the electrical characterization of the charge pumps 32, 32', 32", in a step of electrical testing of the electronic device 30. For this purpose, the control stage 34 is configured so as to generate successive values of the configuration signal SEL<n>, and supply them to the current-generator circuit 10 to generate consecutively different values of the load current $I_L$.

The control stage 34 may moreover control appropriate coupling means or circuitry, designated by 35, for example including a multiplexer, which is set between the current-generator circuit 10 and the charge pumps 32, 32', 32" in such a way as to connect electrically, in a selective way, the current-generator circuit 10 to the output of a charge pump selected from the charge pumps 32, 32', 32", so as to define the load of the charge pump during the operation of electrical testing. In particular, the multiplexer 35 is for this purpose controlled by a control signal $S_{mux}$ supplied by the control stage 34.

The control stage 34 may moreover co-operate with a testing device 36, outside the electronic device 30, to enable reading of the output voltage $V_{out}$ by the selected charge pump, as the load current $I_L$ varies, for the voltage/current characterization of the same charge pump. In particular, the testing device 36 is electrically connected to an output pad 38 present in the chip of the electronic device 30 to read the output voltage $V_{out}$.

In the same FIG. 8, designated by 39 is the chip of semiconductor material in which the electronic device 30 is integrated.

The advantages of the current-generator circuit are evident from the foregoing description. In any case, it is again emphasized that it enables generation, starting from a known reference current, of currents of a value that may be easily configured (via a digital configuration word), which are stable in regard to the spreads of the manufacturing process, of the supply voltage, and of the temperature.

The current-generator circuit 10 affords a considerable saving in occupation of area in the integrated realization, as compared to known approaches.

Furthermore, it may ensure considerable precision during measurements in so far as it is insensitive to the voltage value that is to be measured (for example, the output voltage $V_{out}$ of the charge pump that is to be electrically characterized).

Finally, it is clear that modifications and variations may be made to what has been described and illustrated herein, without thereby departing from the scope of the present invention, as defined in the annexed claims.

For example, it is evident that in the circuit structure of the current-generator circuit 10 a different configuration of the input current mirrors may be envisaged, for example, regarding their number or the factor of multiplication of current implemented thereby, according to the particular requirements and the value of the reference current $I_{ref}$.

In addition, a different type of divider may possibly be used for the resistive divider stage 20, other than the one of the R/2R type, which enables generation of different values of output voltage as a function of an input configuration signal, for example, of a digital type.

Moreover, the current-generator circuit 10 may advantageously be integrated in so-called "test chips", i.e., in integrated devices provided in a dedicated manner for the operations of electrical testing, but also in the final chips to be marketed.

In this case, in particular, the current-generator circuit 10 may have a wide range of uses during operation of the electronic device 30, other than the function of electrical testing described in detail previously, in cases where the supply of electric currents of a controlled and stable value that may be easily configured, is required.

That which is claimed:

1. A circuit for generation of an output current for enabling electrical testing of at least one operating stage comprising:
   an input terminal configured to receive a reference current;
   an output terminal configured to supply the output current;
   a first current mirror coupled between the input terminal and a first internal node;
   a second current mirror coupled between the first internal node and a second internal node, and comprising a first PMOS transistor and a second PMOS transistor;
   a first reference resistor element coupled to the second internal node and having a first value of resistance;
   a first buffer coupled between the second internal node and a third internal node;
   a first reference transistor coupled to a third internal node, and having a control terminal coupled to an output of the first buffer;
   a resistive divider stage coupled to the third internal node and configured to receive a configuration signal;
   a second buffer coupled between the resistive divider stage and a fourth internal node;
   a second reference resistor element coupled to the fourth internal node and having a second value of resistance, wherein the second value of resistance being matched to the first value by a ratio based upon the first value of resistance and a matching factor; and
   a second reference transistor coupled between the fourth internal node and said output terminal, and having a control terminal coupled to an output of the second buffer, wherein the second reference transistor being matched to the second PMOS transistor by a ratio based upon a size of the second PMOS transistor and the matching factor;
   wherein the matching factor is greater than one.

2. The circuit according to claim 1, wherein the second value of resistance of said second reference resistor element is equal to a submultiple of the first value of resistance of said first reference resistor element.

3. The circuit according to claim 1, wherein said first reference resistor element and said second reference resistor element have identical process spread variations.

4. The circuit according to claim 3, wherein the output current is stable in regard to the process spread variations.

5. The circuit according to claim 1, wherein the configuration signal is of an n-bit digital type, n being an integer; and wherein said resistive divider stage is configured to implement a divider of an R/2R type to produce a number $2^n$ of values for a second reference voltage.

6. The circuit according to claim 1, wherein the reference current has a value which is stable in regard to variations of temperature and of a supply voltage, lower than a desired range of values for the output current.

7. An electronic device comprising:
   at least one first operating stage;
   a current generator circuit configured to generate a load current for said at least one first operating stage that has a value configurable based upon a configuration signal;
   said current generator circuit comprising
      an input terminal configured to receive a reference current,
      an output terminal configured to supply the load current,
      a first current mirror coupled between the input terminal and a first internal node,
      a second current mirror coupled between the first internal node and a second internal node, and comprising a first PMOS transistor and a second PMOS transistor,
      a first reference resistor element coupled to the second internal node and having a first value of resistance,
      a first buffer coupled between the second internal node and a third internal node,
      a first reference transistor coupled to a third internal node, and having a control terminal coupled to an output of the first buffer,
      a resistive divider stage coupled to the third internal node and configured to receive the configuration signal,
      a second buffer coupled between the resistive divider stage and a fourth internal node, and
      a second reference resistor element coupled to the fourth internal node and having a second value of resistance, wherein the second value of resistance being matched to the first value by a ratio based upon the first value of resistance and a matching factor, and
      a second reference transistor coupled between the fourth internal node and said output terminal, and having a control terminal coupled to an output of the second buffer, wherein the second reference transistor being matched to the second PMOS transistor by a ratio based upon a size of the second PMOS transistor and the matching factor,
   wherein the matching factor is greater than one.

8. The electronic device according to claim 7, further comprising a reference-generator stage configured to generate the reference current having a stable value in regard to variations of temperature and of a supply voltage.

9. The electronic device according to claim 7, wherein said at least one first operating stage comprises a charge pump to generate an output voltage; and wherein said at least one first operating stage is operable in a mode of electrical characterization of said charge pump which detects a value of the output voltage as the value of the output current is configured based upon the configuration signal.

10. The electronic device according to claim 7, further comprising at least one second operating stage; and a multiplexer configured to couple said at least one first operating stage or at least one second operating stage selectively and alternatively to said current generator circuit during the operating mode as a function of the control signal from said control stage.

11. The electronic device according to claim 7, wherein said at least one first operating stage and said current generator circuit are integrated in one chip of semiconductor material.

12. The electronic device according to claim 7, further comprising an output pad coupled to said at least one operating stage and configured to be coupled to a testing device for detecting a voltage value as the load current varies.

13. The electronic device according to claim 7, wherein the second value of resistance of said second reference resistor element is equal to a submultiple of the first value of resistance of said first reference resistor element.

14. The electronic device according to claim 7, wherein said first reference resistor element and said second reference resistor element have identical process spread variations.

15. The electronic device according to claim 7, wherein the configuration signal is of an n-bit digital type, n being an integer; and wherein said resistive divider stage is configured to implement a divider of an R/2R type to produce a number $2^n$ of values for the second reference voltage.

16. A method for generating a load current for at least one first operating stage of an electronic device, the method comprising:
using a current mirror comprising a first PMOS transistor and a second PMOS transistor to generate an intermediate current;
traversing through a first reference resistor element having a first value of resistance, the intermediate current having a value which is a function of a reference current to supply a first reference voltage;
buffering the first reference voltage to supply a buffered first reference voltage;
receiving from a control stage a configuration signal at a resistive divider stage to supply a second reference voltage as a function of the buffered first reference voltage and of the configuration signal;
buffering the second reference voltage to supply a buffered second voltage;
using a second reference resistor element to supply, as a function of the buffered second reference voltage, the load current and having a second value of resistance, wherein the second value of resistance being matched to the first value by a ratio based upon the first value of resistance and a matching factor;
selectively coupling said at least one first operating stage to the second reference resistor using a second reference transistor, wherein the second reference transistor being matched to the second PMOS transistor by a ratio based upon a size of the second PMOS transistor and the matching factor;
wherein the matching factor is greater than one.

17. The method according to claim 16, further comprising using a reference-generator stage to generate the reference current having a stable value in regard to variations of temperature and of a supply voltage.

18. The method according to claim 16, wherein the at least one first operating stage and the second reference resistor element are integrated in one chip of semiconductor material.

19. The method according to claim 16, wherein a second value of resistance of the second reference resistor element is equal to a submultiple of a first value of resistance of the first reference resistor element.

20. The method according to claim 16, wherein the configuration signal is of an n-bit digital type, n being an integer; and wherein the resistive divider stage is configured to implement a divider of an R/2R type to produce a number $2^n$ of values for the second reference voltage.

* * * * *